United States Patent [19]
Ota et al.

[11] Patent Number: 5,905,277
[45] Date of Patent: May 18, 1999

[54] FIELD-EFFECT TRANSISTOR AND METHOD OF MANUFACTURING THE SAME

[75] Inventors: Yorito Ota, Hyogo; Hiroyuki Masato, Osaka; Shigeru Morimoto, Osaka; Junko Iwanaga, Osaka, all of Japan

[73] Assignee: Matsushita Electric Industrial Co., Ltd., Osaka, Japan

[21] Appl. No.: 09/081,054

[22] Filed: May 19, 1998

[30] Foreign Application Priority Data

May 20, 1997 [JP] Japan ........................ 9-129157

[51] Int. Cl.⁶ ............. H01L 31/328; H01L 31/336; H01L 31/72; H01L 31/109
[52] U.S. Cl. .............. 257/192; 257/194; 257/195
[58] Field of Search ............... 257/192, 194, 257/195

[56] References Cited

U.S. PATENT DOCUMENTS

| | | | |
|---|---|---|---|
| 3,763,408 | 10/1973 | Kano et al. | 317/235 R |
| 4,350,993 | 9/1982 | Wieder | 357/29 |
| 5,399,886 | 3/1995 | Hasegawa | 257/192 |
| 5,504,352 | 4/1996 | Tsutsui et al. | 257/194 |

FOREIGN PATENT DOCUMENTS

| | | | |
|---|---|---|---|
| 57-211778 | 12/1982 | Japan . | |
| 1-293667 | 11/1989 | Japan . | |
| 3248438 | 11/1991 | Japan | 257/194 |
| 5095006 | 4/1993 | Japan | 257/192 |
| 0539690 | 5/1993 | Japan | 257/192 |
| 5166843 | 7/1993 | Japan | 257/192 |

OTHER PUBLICATIONS

No Author, "Novel Fabrication Process for Creating T–Gate Transistors", *IBM Technical Disclosure Bulletin*, vol. 33, No. 4, Sep. 1990, pp. 200–201.

*Primary Examiner*—William Mintel
*Attorney, Agent, or Firm*—McDermott, Will & Emery

[57] ABSTRACT

A channel layer made of n-type GaAs doped with Si, a hole absorption layer made of InGaAs having a valance band higher in energy level than that of GaAs, and an undoped layer made of GaAs are formed sequentially on a semi-insulating substrate made of GaAs. A gate recess region having a pair of sidewall portions each consisting of an upper sidewall composed of the undoped layer and a lower sidewall composed of the hole absorption layer is formed on the channel region. The channel region is exposed in the gate recess region. An indent having an undercut configuration is formed in the lower sidewall of the gate recess region. A gate electrode is formed to extend over a stepped portion composed of the sidewall portion of the gate recess region closer to a drain electrode.

6 Claims, 6 Drawing Sheets

FIELD-EFFECT TRANSISTOR AND METHOD OF MANUFACTURING THE SAME

BACKGROUND OF THE INVENTION

The present invention relates to a field-effect transistor. More particularly, it relates to a power field-effect transistor of which high voltage operation is required and to a manufacturing method therefor.

For the achievement of diversified means for communication and improved quality thereof, analog signal modulation techniques have been replaced by digital signal modulation techniques. In the field of radio communication, the use of higher frequencies has spread more rapidly than ever. With the recent RF device developments in communication represented by a mobile telephone, there has been greater demand for field-effect transistors using gallium arsenide (GaAs) due to their low-noise and low-distortion properties suitable for digital communication and their high-speed and high-frequency properties superior to those of silicon devices. In particular, a power FET used in a transmission amplifier has been widely utilized to take advantage of GaAs consuming low power.

An important issue for the power FET is higher voltage operation, and consequently higher breakdown voltage. The breakdown voltage of the power FET is determined by the concentration of an impurity in a region immediately below a gate electrode and the distance between the gate and drain electrodes. Naturally, the breakdown voltage is higher as the impurity concentration is lower or the distance between the gate and drain electrodes is larger. With a MESFET (Metal Semiconductor FET) in which a channel region is formed by implanting ions into a substrate and a gate electrode is formed directly on the channel region, high breakdown voltage cannot be achieved due to a high impurity concentration in the region immediately below the gate electrode. With a MESFET in which an undoped layer composed of an epitaxial film containing no impurity is formed immediately under a gate electrode, high breakdown voltage can be achieved due to a low impurity concentration in a region immediately below the gate electrode.

Referring to the drawings, a conventional MESFET comprising an undoped layer between a gate electrode and a channel layer will be described.

FIG. 7 shows a cross-sectional structure of the conventional MESFET using GaAs. As shown in the drawing, a channel layer 92 made of n-type GaAs doped with Si as an impurity and an undoped layer 93 made of GaAs or AlGaAs are formed sequentially on a semi-insulating substrate 91 made of GaAs. A pair of contact layers 94 made of n-type GaAs highly doped with Si as an impurity are formed on the undoped layer 93 to have a given gap therebetween. A source electrode 97 and a drain electrode 98 each made of deposited AuGe or the like are formed on the respective contact layers 94. A gate electrode 99 made of deposited Al or the like is formed on the undoped layer 93 between the source and drain electrodes 97 to make Schottky contact with the undoped layer 93.

Since the undoped layer 93 is provided between the gate electrode 99 and the channel layer 92 in the conventional MESFET, the absolute breakdown voltage thereof is improved. On the other hand, a maximum breakdown voltage for the drain electrode is not considerably improved due to an electric field localized to the region underlying the edge portion of the gate electrode 99 closer to the drain electrode 98. To achieve higher value, therefore, the distance between the gate and drain electrodes should be increased because the maximum breakdown voltage for the drain electrode is dependent only on the distance between the gate and drain electrodes. However, the increased distance between the gate and drain electrodes increases a resistance between the gate and drain electrodes as well as the on-resistance of the FET, which degrades the characteristics of the FET.

Under the circumstances under which the phenomenon of avalanche breakdown that determines the value of breakdown voltage occurs, numerous electron-hole pairs are generated in the region of the channel layer 92 underlying the edge portion of the gate electrode 99 closer to the drain electrode 98 and eventually cause a runaway effect in the FET. Thus, higher breakdown voltage is incompatible with improvements in other electric properties, while stable operation cannot be performed with voltage close to a maximum breakdown value.

SUMMARY OF THE INVENTION

In view of the foregoing, it is therefore an object of the present invention to implement a field-effect transistor with high breakdown voltage and low on-resistance which can perform stable operation even with voltage close to a maximum breakdown value.

To attain the object, the present invention provides a hole absorption layer on a substrate between a gate electrode and a drain electrode such that the hole absorption layer captures holes forming electron-hole pairs produced and allows the captured holes to flow to the drain-side region of the substrate.

A first field-effect transistor according to the present invention comprises: a channel layer doped with an impurity and formed on a semi-insulating substrate; an undoped layer formed in a drain-side region of a gate-electrode formation region on the channel layer to have a stepped portion formed in an edge portion thereof close to the gate-electrode formation region; a gate electrode formed indiscretely on the channel layer and the undoped layer in such a manner as to extend over the stepped portion; and a hole absorption layer formed in a region located between the channel layer and the undoped layer such that an indent is formed between the hole absorption layer and a drain-side side face of the gate electrode.

In the first field-effect transistor, the undoped layer is formed in the drain-side region of the gate formation region on the channel layer to have the stepped portion in the edge portion thereof close to the gate electrode, while the gate electrode is formed in such a manner as to extend over the stepped portion. Consequently, the upper portion of the gate electrode shifted in position toward the drain electrode is in contact with the undoped layer, while the lower portion of the gate electrode is in contact with the channel layer, which reduces the intensity of an electric field generated around the drain-side edge portion of the gate electrode with the application of a gate bias. As a result, sufficient breakdown voltage is achieved even when the distance between the gate and drain electrodes is reduced. Since the source-side contact region can be brought into the closest proximity to the source-side side face of the gate electrode, source resistance is reduced and therefore the on-resistance on a rising edge of the FET is reduced.

Moreover, since the hole absorption layer is provided in the region located between the channel layer and the undoped layer to have an indent formed between the hole absorption layer and the drain-side side face of the gate electrode, the hole absorption layer captures holes forming electron-hole pairs produced upon an avalanche breakdown when the valence band of the hole absorption layer is higher in energy level than that of the channel layer. Furthermore, since the undoped layer is formed in the drain-side region, the holes diffuse into the drain-side region, without flowing directly into the gate electrode, to be recombined with the electrons within the contact region or within the drain electrode. This prevents the holes forming the electron-hole pairs produced upon the avalanche breakdown from flowing directly into the gate electrode, so that an increase in the leakage current from the gate electrode is suppressed. This improves breakdown voltage, suppresses a runaway effect in the FET, and thereby enables stable operation with voltage close to a maximum breakdown value.

A second field-effect transistor according to the present invention comprises: a channel layer doped with an impurity and formed on a semi-insulating substrate; an insulating layer formed in a drain-side region of a gate-electrode formation region on the channel layer to have a stepped portion formed in an edge portion thereof close to the gate-electrode formation region; a gate electrode formed indiscretely on the channel layer and the insulating layer in such a manner as to extend over the stepped portion; and a hole absorption layer formed in a region located between the channel layer and the insulating layer such that an indent is formed between the hole absorption layer and a drain-side side face of the gate electrode.

The second field-effect transistor can be implemented by replacing the undoped layer with the insulating layer in the first field-effect transistor. Accordingly, the second field-effect transistor can achieve the same effects as achieved by the first field-effect transistor.

In the first or second field-effect transistor, the channel layer is preferably a semiconductor layer made of n-type GaAs and the hole absorption layer is preferably a semiconductor layer made of InGaAs or p-type GaAs. In the arrangement, the hole absorption layer has a valence band higher in energy level than that of the channel layer, which ensures the capturing of the holes forming the electron-hole pairs resulting from the avalanche breakdown.

A third field-effect transistor according to the present invention comprises: a semi-insulating substrate; a source contact region and a drain contact region formed in the semi-insulating substrate to have a given gap therebetween, each of the source and drain contact regions being highly doped with an impurity of a first conductivity type; a channel region formed in a region of the semi-insulating substrate located between the source and drain contact regions to provide connection between the source and drain contact regions, the channel region being doped with an impurity of the first conductivity type; a gate electrode formed on the channel region; and a hole absorption region formed under the channel region to be located between the gate electrode and the drain contact region, the hole absorption region being doped with an impurity of a second conductivity type and having an edge portion connected to the drain contact region.

In the third field-effect transistor, the hole absorption region is provided under the channel region to be located between the gate and drain electrodes such that the edge portion thereof close to the drain contact region is connected to the drain contact region. When the valence band of the hole absorption region is higher in energy level than that of the channel region, therefore, the hole absorption region captures holes forming electron-hole pairs produced upon an avalanche breakdown. Furthermore, since the hole absorption region is connected to the drain contact region, the holes diffuse into the drain contact region, without flowing directly into the gate electrode, to be recombined with the electrons within the drain contact region or within the drain electrode. This prevents the holes forming the electron-hole pairs produced upon the avalanche breakdown from flowing directly into the gate electrode, so that an increase in the leakage current from the gate electrode is suppressed. This improves breakdown voltage, suppresses a runaway effect in the FET, and enables stable operation with voltage close to a maximum breakdown value.

In the third field-effect transistor, the semi-insulating substrate is preferably made of GaAs, the first conductivity type is preferably n-type, and the second conductivity type is preferably p-type. In the arrangement, the hole absorption region has a valence band higher in energy level than that of the channel region, which ensures the capturing of the holes forming the electron-hole pairs resulting from the avalanche breakdown.

A first method of manufacturing a field-effect transistor according to the present invention comprises the steps of: sequentially forming, on a semi-insulating substrate, a channel layer doped with an impurity, a hole absorption layer, an undoped layer, and a contact forming layer highly doped with an impurity; forming, on the contact forming layer, a source electrode and a drain electrode such that a given gap is allowed therebetween, each of the source and drain electrodes being composed of a first conductor film to be brought into ohmic contact with the contact forming layer; etching a region of the contact forming layer located between the source and drain electrodes till the undoped layer is exposed to form a source contact layer and a drain contact layer of the contact forming layer; etching respective gate-recess formation regions of the undoped layer and the hole absorption layer till the channel layer is exposed to form a gate recess region having sidewall portions each constituted by an upper sidewall composed of the undoped layer and a lower sidewall composed of the hole absorption layer; selectively etching the lower sidewall of the gate recess region to form an indent having an undercut configuration in the lower sidewall; and depositing, on the semi-insulating substrate, a second conductor film extending over the sidewall portion of the gate recess region closer to the drain electrode to form a gate electrode composed of the second conductor film to be brought into Schottky contact with the channel layer and the undoped layer such that a given gap is allowed between the gate electrode and the sidewall portion of the gate recess region close to the source electrode and that an indent is formed between the gate electrode and the lower sidewall of the sidewall portion of the gate recess region close to the drain electrode.

In accordance with the first method of manufacturing a field-effect transistor, the second conductor film deposited to extend over the sidewall portion of the gate recess portion close to the drain electrode allows a given distance between the gate electrode and the sidewall portion of the gate recess region close to the source electrode, while the indent is formed between the gate electrode and the lower sidewall of the sidewall portion of the gate recess region close to the drain electrode. In addition, the gate electrode formed to make Schottky contact with the channel layer and the undoped layer close to the drain electrode ensures the implementation of the first field-effect transistor according to the present invention.

A second method of manufacturing a field-effect transistor according to the present invention comprises the steps of: selectively implanting impurity ions of a first conductivity type into a semi-insulating substrate to form a channel region between a source-electrode formation region and a drain-electrode formation region of the semi-insulating substrate, while selectively implanting impurity ions of a second conductivity type into a region of the semi-insulating substrate underlying the channel region to form a hole absorption region between a gate-electrode formation region and the drain-electrode formation region of the semi-insulating substrate; selectively implanting impurity ions of the first conductivity type at a high concentration into the semi-insulating substrate to form a source contact region connected to an edge portion of the channel region close to the source-electrode formation region and a drain contact region connected to respective edge portions of the channel region and the hole absorption region close to the drain-electrode formation region; depositing a first conductor film over the source-electrode formation region of the source contact region and the drain-electrode formation region of the drain contact region to form a source electrode to be brought into ohmic contact with the source contact region and a drain electrode to be brought into ohmic contact with the drain contact region; and depositing a second conductor film over the gate-electrode formation region of the channel region to form a gate electrode composed of the second conductor film to be brought into Schottky contact with the channel region.

In accordance with the second method of manufacturing a field-effect transistor, the impurity ions of the second conductivity type are selectively implanted into the region of the semi-insulating substrate underlying the channel region to form the hole absorption region between the gate-electrode formation region and the drain-electrode formation region, while the impurity ions of the first conductivity at a high concentration are selectively implanted into the semi-insulating substrate to form the drain contact region such that it is connected to the respective edge portions of the channel region and the hole absorption region close to the drain-electrode formation region. This ensures the implementation of the third field-effect transistor according to the present invention.

BRIEF DESCRIPTION OF THE DRAWINGS

FIGS. 3 are schematic diagrams qualitatively illustrating the flow of electrons in the field-effect transistor in the normal state, electron-hole pairs produced upon an avalanche breakdown, and the flow of the holes, of which

DETAILED DESCRIPTION OF THE INVENTION

Embodiment 1

A first embodiment of the present invention will be described with reference to the drawings.

Figure 1:
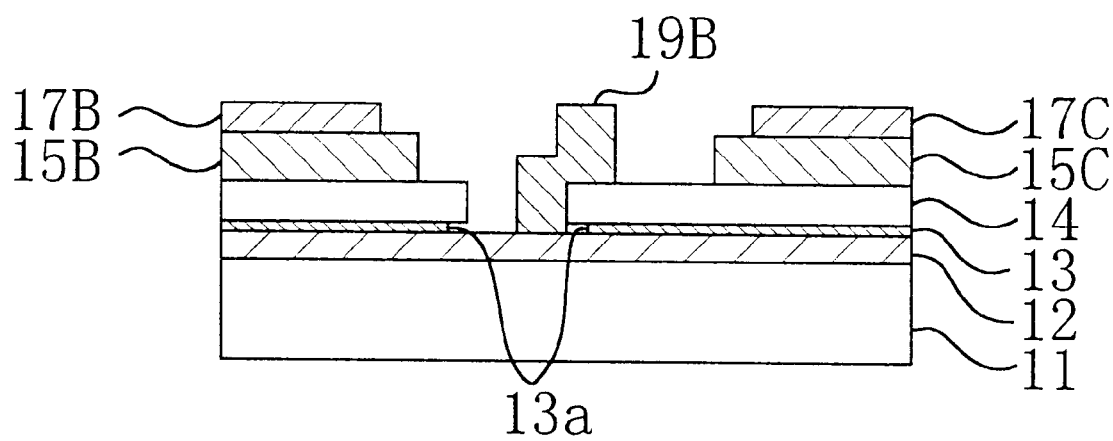
FIG. 1 shows a cross-sectional structure of a field-effect transistor according to a first embodiment of the present invention.

FIG. 1 shows a cross-sectional structure of a field-effect transistor according to a first embodiment of the present invention. As shown in the drawing, a channel layer 12 made of n-type GaAs doped with Si as an impurity, a hole absorption layer 13 made of a material such as semi-insulating InGaAs in the case of a heterojunction or p-type GaAs in the case of a homojunction which has a valence band higher in energy level than that of the valence band of GaAs, and a pair of undoped layers 14 each made of GaAs or AlGaAs are formed sequentially on a semi-insulating substrate 11 made of GaAs.

A gate recess region is formed on the channel layer 12 such that the channel layer is exposed therein. The gate recess region has a pair of sidewall portions each consisting of an upper sidewall composed of the undoped layer 14 and a lower sidewall composed of the hole absorption layer 13. An indent 13a having an undercut configuration is also formed in the lower sidewall. A source contact layer 15B and a drain contact layer 15C each made of n-type GaAs highly doped with Si are formed on the respective undoped layers 14 with the gate recess region interposed therebetween. A source electrode 17B made of AuGe or the like is formed on the source contact layer 15B to make ohmic contact therewith, while a drain electrode 17C made of AuGe or the like is formed on the drain contact layer 15C to make ohmic contact therewith.

A gate electrode 19B made of Al or the like has a given gap between itself and the sidewall portion of the gate recess region close to the source electrode 17B, while extending over a stepped portion composed of the sidewall portion of the gate recess region close to the drain electrode 17C. The gate electrode 19B consists of an upper portion shifted in position toward the drain electrode 17C to make Schottky contact with the undoped layer 14 and a low er portion in Schottky contact with the channel layer 12. The gate electrode 19B is designed such that the indent 13a is formed between the lower portion and the bottom portion of the stepped portion.

A description will be given to a method of manufacturing the field-effect transistor according to the first embodiment with reference to the drawings. FIGS. 2(a) to 2(e) show cross-sectional structures in individual process steps in accordance with the method of manufacturing the field-effect transistor according to the present embodiment.

Figure 2A:
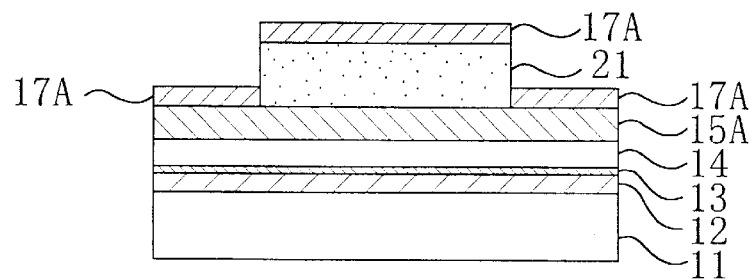
FIGS. 2(a) to 2(e) are cross-sectional views illustrating process steps in accordance with a method of manufacturing the field-effect transistor according to the first embodiment.

First, as shown in FIG. 2(a), the channel layer 12 made of n-type GaAs doped with Si, the hole absorption layer 13 made of semi-insulating InGaAs or p-type GaAs, the undoped layer 14 made of GaAs or AlGaAs, and a contact forming layer 15A made of n-type GaAs highly doped with Si are formed sequentially on the semi-insulating substrate 11 made of GaAs by using a crystal growing technique such as CVD, resulting in a multilayer structure. Thereafter, a first resist pattern 21 having respective apertures corresponding to a source-electrode formation region and a drain-electrode formation region having a specified gap therebetween is formed on the contact forming layer 15A. Subsequently, a metal film 17A as a first conductor film made of AuGe/Ni or the like is formed by vapor deposition over the entire surface of the semi-insulating substrate 11. The first resist pattern 21 is then lifted off, whereby the source and drain electrodes 17B and 17C are formed on the contact forming layer 15A.

Figure 2B:
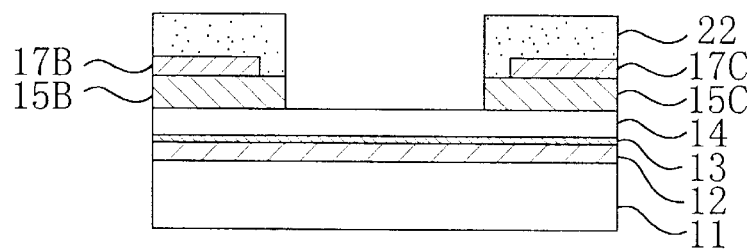

Next, as shown in FIG. 2(b), thermal treatment is performed with respect to the semi-insulating substrate 11 to bring the source and drain electrodes 17B and 17C into ohmic contact with the contact forming layer 15A. After that, a second resist pattern 22 for masking the source-contact and drain-contact formation regions of the contact forming layer 15A is formed on the semi-insulating substrate 11. Subsequently, etching is performed with respect to the contact forming layer 15A masked with the second resist pattern 22 till the undoped layer 14 is exposed, thereby forming the source and drain contact layers 15B and 15C of the contact forming layer 15A.

Figure 2C:
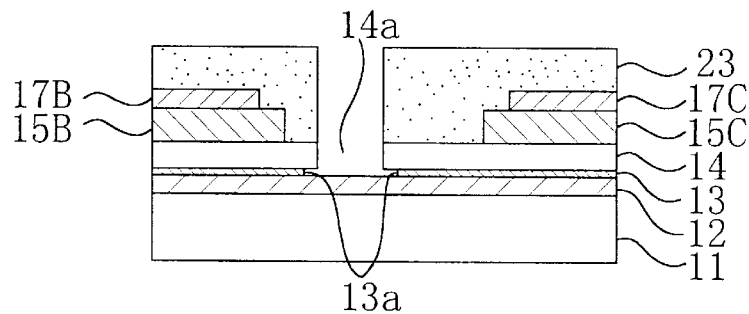

Next, as shown in FIG. 2(c), the second resist pattern 22 is removed and a third resist pattern 23 having an aperture corresponding to a gate-recess formation region is formed on the semi-insulating substrate 11. Then, wet etching is performed with respect to the hole absorption layer 13 and the undoped layer 14 masked with the third resist pattern 23 till the channel layer 12 is exposed, thereby forming the gate recess region 14a having the sidewall portions each consisting of the upper sidewall composed of the undoped layer 12 and the lower sidewall composed of the hole absorption layer 13. Subsequently, wet etching using a chloric acid is performed selectively with respect to the hole absorption layers 13 composing the lower sidewalls of the gate recess region 14a, thereby forming the lower sidewalls of the gate recess region 14a into the indents 13a each having an undercut configuration.

Figure 2D:
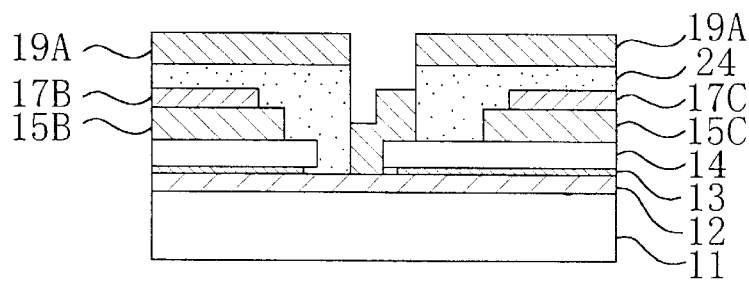

Next, as shown in FIG. 2(d), the third resist pattern 23 is removed and a fourth resist pattern 24 having an aperture corresponding to a region of the gate recess region 14a including the sidewall portion close to the drain electrode 17C is formed on the semi-insulating substrate 11. Then, a metal film 19A as a second conductor film made of Al or the like is deposited over the entire surface of the semi-insulating substrate 11.

Figure 2E:
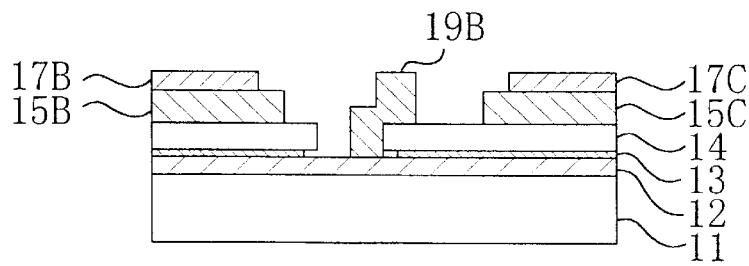

Next, as shown in FIG. 2(e), the fourth resist pattern 24 is lifted off, whereby the gate electrode 19B made of Al or the like is formed to extend over the sidewall portion of the gate recess region 14a close to the drain electrode 17C, while the indent 13a is formed between the gate electrode 19B and the lower sidewall composed of the hole absorption layer 13.

A description will be given next to the operation of the field-effect transistor thus constituted.

Figure 3A:
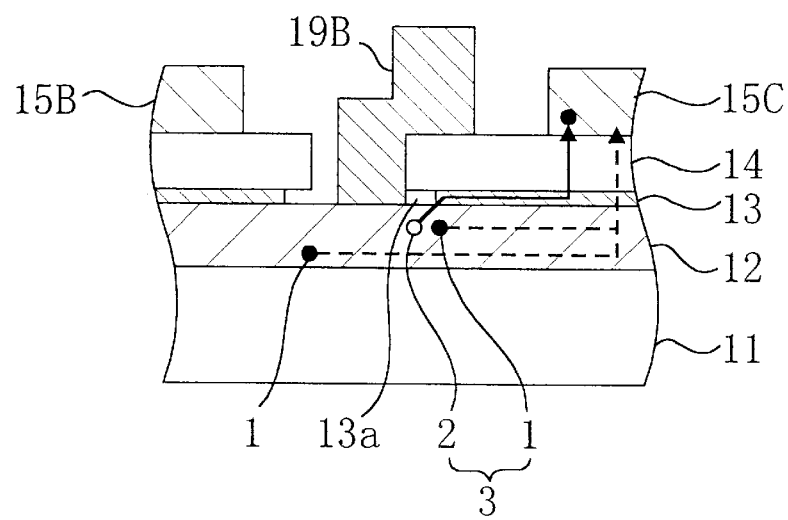
FIG. 3(a) shows the cross-sectional structure of the field-effect transistor according to the first embodiment.

FIG. 3(a) shows a cross-sectional structure of the field-effect transistor according to the present embodiment. The drawing qualitatively illustrates the flow of electrons in the normal state, electron-hole pairs resulting from an avalanche breakdown caused in the region of the channel layer 12 underlying the drain-side edge of the gate electrode, and the flow of the holes. In FIG. 3(a), the description of like components used in FIG. 1 will be omitted by assigning thereto like reference numerals. As shown in FIG. 3(a), the electrons 1 implanted into the region of the substrate close to the source contact layer 15B flow into the region thereof close to the drain contact layer 15C through the channel layer 12. In the case where a gate bias sufficient to cause the avalanche breakdown is applied to the gate electrode 19B, on the other hand, numerous electron-hole pairs 3 are produced in the region of the channel region 12 underlying the drain-side edge of the gate electrode 19B.

Since the present embodiment has provided the hole absorption layer 13 made of semi-insulating InGaAs or p-type GaAs each having a valence band higher in energy level than that of the channel layer 12 between the drain-side side face of the gate electrode 19B and the drain contact layer 15C in the region located between the channel layer 12 and the undoped layer 14, the holes 2 generated in the region of the channel layer 12 underlying the drain-side edge of the gate electrode 19B are captured by the hole absorption layer 13. Since the hole absorption layer 13 is not in immediate contact with the drain-side side face of the gate electrode 19B, the captured holes 2 flow only into the drain contact layer 15C without flowing into the gate electrode 19. Thereafter, the holes 2 are recombined with other electrons 1 within the highly doped n-type drain contact layer 15C. During the recombination process, a drain current is slightly increased to complement the recombination. However, since the rate of the slight increase accounts for several percent or less of a drain-to-source current, an influence on the operation of the FET is negligible.

Figure 3B:
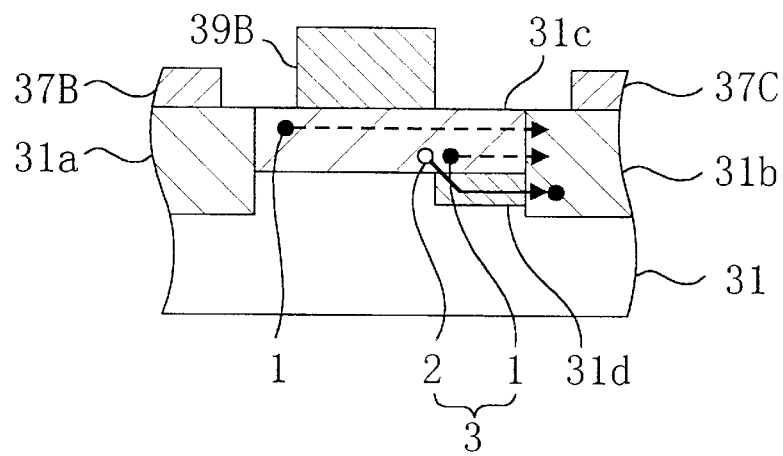
FIG. 3(b) shows a cross-sectional structure of a field-effect transistor according to a second embodiment of the present invention.
Figure 3C:
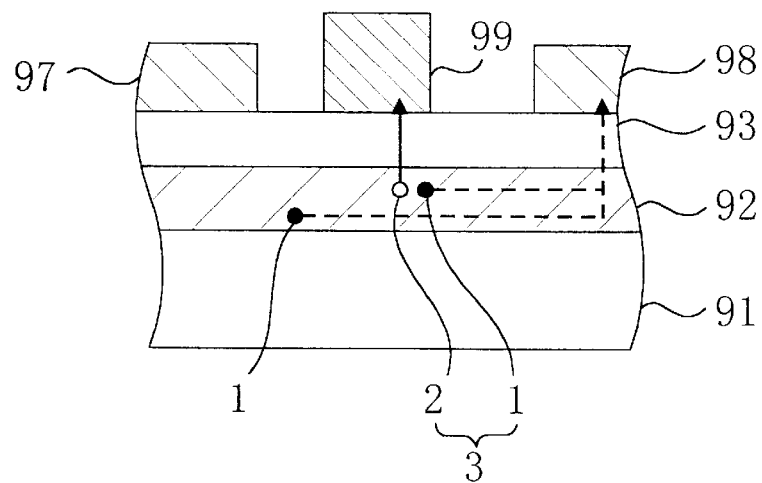
FIG. 3(c) shows a cross-sectional structure of a conventional field-effect transistor.

In a conventional MESFET comprising the undoped layer 93 formed under the gate electrode as shown in FIG. 3(c), on the other hand, a large number of holes 2 produced upon an avalanche breakdown flow directly into the gate electrode 99 to which a negative bias is commonly applied as in a GaAs FET. This is because the gate electrode 99 at a negative potential has a minimum potential difference with the holes having positive charges and therefore becomes stable. This increases a leakage current from the gate electrode 99 and eventually causes a runaway effect in the FET.

By contrast, the present embodiment has provided the hole absorption layer 13 made of semi-insulating InGaAs or p-type GaAs each having a valence band higher in energy level than that of the channel layer 12 between the drain-side side face of the gate electrode 19B and the drain contact layer 15C in the region located between the channel layer 12 and the undoped layer 14 such that the hole absorption layer 13 is not in immediate contact with the drain-side side wall of the gate electrode 19B. Consequently, the holes 2 produced upon the avalanche breakdown are captured by the hole absorption layer 13 having a stable energy level for the holes 2 and then diffuse into the high-concentration drain contact layer 15C to be recombined with other electrons within the drain contact layer 15C. Since the holes 2 do not flow into the gate electrode 19B, an increase in the leakage current from the gate electrode 19B is suppressed, which improves breakdown voltage, prevents a runaway effect in the FET, and thereby enables stable operation with voltage close to a maximum breakdown value.

Moreover, since the present embodiment is characterized in that the gate electrode 19B consists of the upper portion shifted in position toward the drain electrode and in contact with the undoped layer 14 and the lower portion in contact with the channel layer, an electric field formed around the drain-side edge of the gate electrode with the application of a gate bias is reduced in intensity, so that sufficient breakdown voltage is achieved even when the distance between the gate and drain electrodes is reduced. This greatly reduces the on-resistance on a rising edge of the FET.

Furthermore, since the source-side side face of the gate electrode has a gap between itself and the edge of the source-side undoped layer 14 close to the gate electrode 19B, the gate electrode 19B can be formed in the closest proximity to the source contact region 15b as long as breakdown voltage permits, resulting in lower source resistance.

Figure 4:
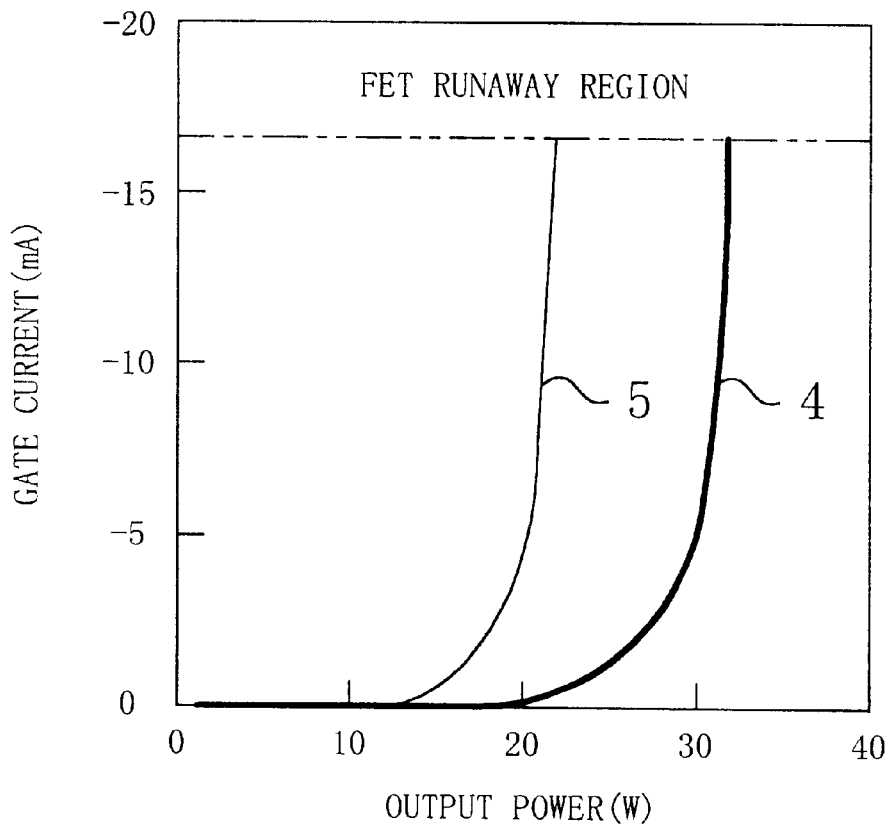
FIG. 4 is a graph showing for comparison the results of measuring output power and a gate current in each of the field-effect transistor according to the first embodiment and a conventional GaAs MESFET and the respective relationships established therebetween.

FIG. 4 shows for comparison the results of measuring output power and a gate current in each of the field-effect transistor according to the first embodiment and a conventional GaAs MESFET and the respective relationships established therebetween. In the drawing, the curve 4 indicates the MESFET according to the present embodiment and the curve 5 indicates the conventional MESFET. It has been proved that, in general, a gate current of about 17 mA that has been generated spontaneously causes a runaway effect with a gate width of about 30 mm. As indicated by the curve 5 in FIG. 4, a gate current of about 17 mA was allowed to flow with an output of about 20 W and caused a runaway effect. In the MESFET according to the present embodiment, by contrast, a gate current of about 17 mA was allowed to flow with about 30 W but did not cause a runaway effect as indicated by the curve 4 in FIG. 4.

Since the hole absorption layer 13 made of semi-insulating InGaAs or p-type GaAs each having a valence band higher in energy level than that of the channel layer 12 has thus been provided between the drain-side side face of the gate electrode 19B and the drain contact layer 15C in the region located between the channel layer 12 and the undoped layer 14, the hole absorption layer 13 gives a remarkable influence particularly on improvements in the characteristics of a power FET.

It is to be noted that, in the present embodiment, the undoped layer 14 for reducing the intensity of the electric field in the region of the channel layer 12 underlying the gate electrode 19B and supporting the upper portion of the gate electrode 19B shifted in position toward the drain electrode may use an insulator to compose the edge portion thereof close to the gate electrode 19B. The undoped layer 14 also has wide applications without depending on the type of the channel layer even when a material other than GaAs is used.

Although the hole absorption layer 13 has been made of semi-insulating InGaAs or p-type GaAs, semi-insulating InGaAs may be of either n-type or p-type since semi-insulating InGaAs has a valence band higher in energy level than that of the channel layer 12 even when it is doped with an impurity.

The reason why the lower part of the gate electrode 19B is formed with the recessed portion and the undoped layer 14 and the hole absorption layer 13 are not provided over the entire surface of the semi-insulating substrate 11 is that it becomes difficult for the gate electrode 19B to control the channel layer 12 via the hole absorption layer 13 with a smaller band indent. Therefore, the present embodiment uses the bottom of the lower portion of the gate electrode 19B which is in immediate contact with the channel layer 12 to control a drain-to-source current flowing through the channel layer 12.

Embodiment 2

A second embodiment of the present invention will be described with reference to the drawings.

Figure 5:
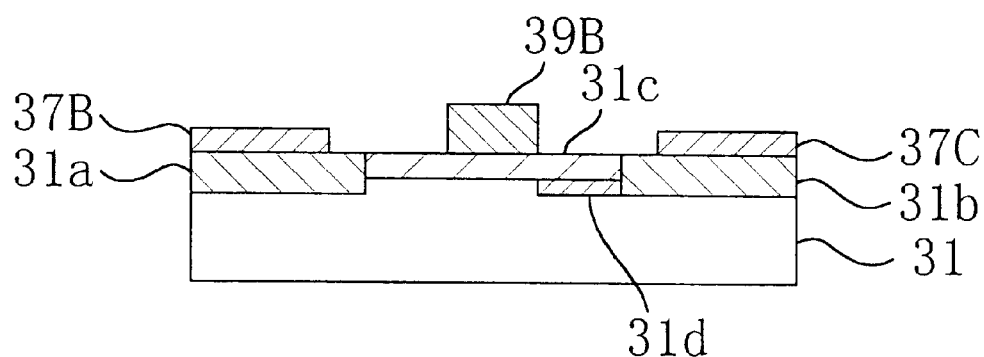
FIG. 5 shows the cross-sectional structure of the field-effect transistor according to the second embodiment.

FIG. 5 shows a cross-sectional structure of a planar field-effect transistor according to the second embodiment. As shown in the drawing, a source contact region 31a and a drain contact region 31b each highly doped with Si as an n-type impurity of a first conductivity type are formed in a semi-insulating substrate 31 made of GaAs to have a specified gap therebetween. The region of the semi-insulating substrate 31 located between the source and drain contact regions 31a and 31b is also doped with Si as the n-type impurity to form a channel region 31c for providing connection between the source and drain contact regions 31a and 31b.

A source electrode 37B made of vapor deposited AuGe or the like is formed on the source contact region 31a of the semi-insulating substrate 31 to make ohmic contact therewith. A drain electrode 37C made of vapor deposited AuGe or the like is formed on the drain contact region 31b of the semi-insulating substrate 31 to make ohmic contact therewith. A gate electrode 39B made of vapor deposited Al or the like is formed on the channel region 31c of the semi-insulating substrate 31 to make Schottky contact therewith.

The present embodiment is characterized in that a hole absorption region 31d doped with Mg as a p-type impurity of a second conductivity type is formed under the channel region 31c between the gate electrode 39B and the drain contact region 31b such that holes resulting from an avalanche breakdown flow into the hole absorption region 31d.

A description will be given to a method of manufacturing the field-effect transistor according to the second embodiment with reference to the drawings. FIGS. 6(a) to 6(f) show cross-sectional structures in individual process steps in accordance with the method of manufacturing the field-effect transistor according to the present embodiment.

Figure 6A:
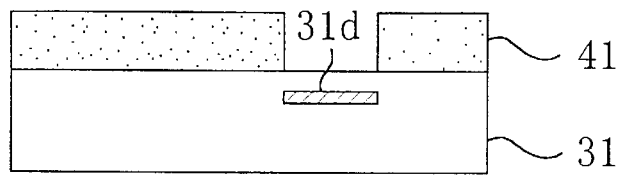
FIGS. 6(a) to 6(f) illustrate process steps in accordance with a method of manufacturing the field-effect transistor according to the second embodiment.

First, as shown in FIG. 6(a), a first resist pattern 41 having an aperture for forming the hole absorption region is formed on the semi-insulating substrate 31 made of GaAs. Then, Mg ions as P-type impurity ions are implanted into the semi-insulating substrate 31 masked with the first resist pattern 41 to form the hole absorption region 31d deep into the semi-insulating substrate 31.

Figure 6B:
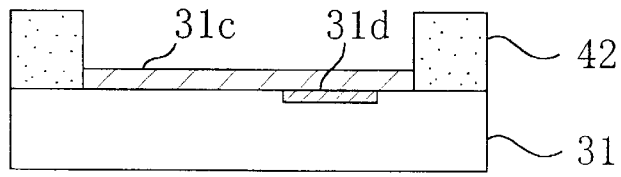

Next, as shown in FIG. 6(b), the first resist pattern 41 is removed and a second resist pattern 42 is formed on the semi-insulating substrate 31 to mask the both ends of the substrate along the gate length thereof. Then, Si ions are implanted in the semi-insulating substrate 31 masked with the second resist pattern 42 to form the n-type channel region 31c overlying the hole absorption region 31c and extending between the both ends of the semi-insulating substrate 31 along the gate length thereof.

Figure 6C:
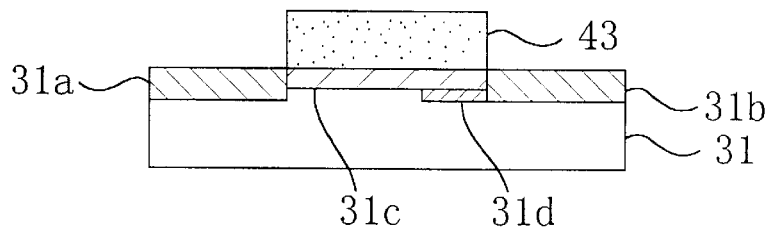

Next, as shown in FIG. 6(c), the second resist pattern 42 is removed and a third resist pattern 43 having respective apertures for forming the source and drain contact regions is formed on the semi-insulating substrate 31 to mask the channel region 31c. Then, Si ions at a high concentration are implanted in the semi-insulating substrate 31 masked with the third resist pattern 43 to form the source contact region 31a in a source-electrode formation region such that the source contact region 31a is connected to the edge portion of the channel region 31c closer to the source-electrode formation region and the drain contact region 31b in a drain-electrode formation region such that the drain contact region 31b is connected to the edge portion of the channel region 31c close to the drain-electrode formation region.

Figure 6D:
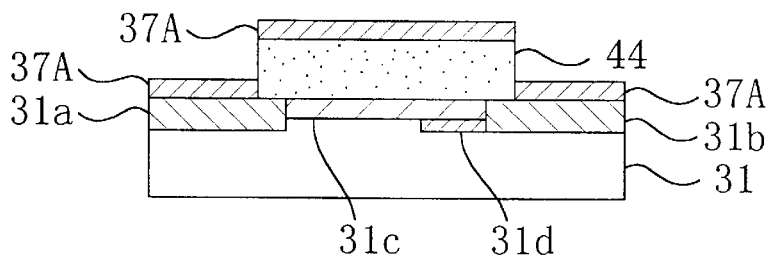

Next, as shown in FIG. 6(d), the removal of the third resist pattern 43 is followed by thermal treatment performed with respect to the semi-insulating substrate 31, whereby the impurities contained in the respective regions formed by ion implantation are activated. Thereafter, a fourth resist pattern 44 having respective apertures corresponding to source-electrode and drain-electrode formation regions are formed on the semi-insulating substrate 31, followed by a metal film 37A made of AuGe/Ni or the like deposited as the first conductor film over the entire surface of the semi-insulating substrate 31.

Figure 6E:
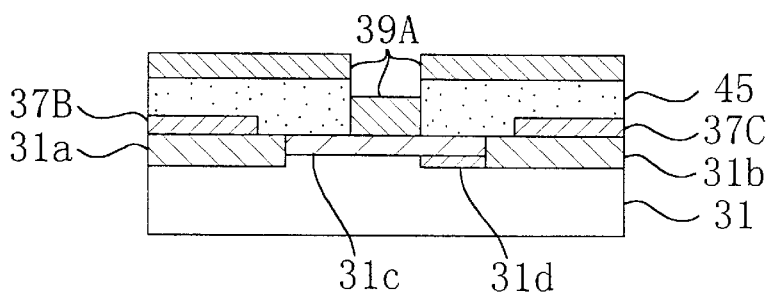

Next, as shown in FIG. 6(e), the fourth resist pattern 44 is lifted off, whereby the source and drain electrodes 37B and 37C are formed on the source contact region 31a and on the drain contact region 31b, respectively. Subsequently, thermal treatment is performed with respect to the semi-insulating substrate 31 to bring the source electrode 37B into ohmic contact with the source contact region 31a, while bringing the drain electrode 37C into ohmic contact with the drain contact region 31b. Thereafter, a fifth resist pattern 45 having an aperture corresponding to a gate-electrode formation region is formed on the semi-insulating substrate 31, followed by a metal film 39A made of Al or the like deposited as a second conductor film over the entire surface of the semi-insulating substrate 31.

Figure 6F:
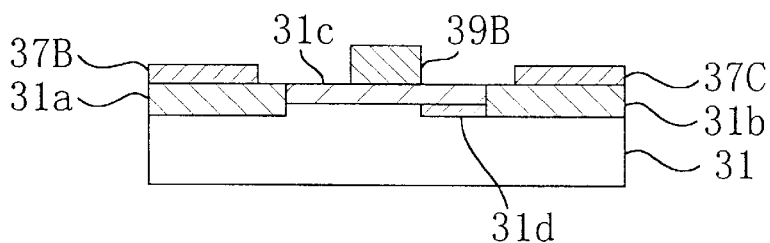
Figure 7:
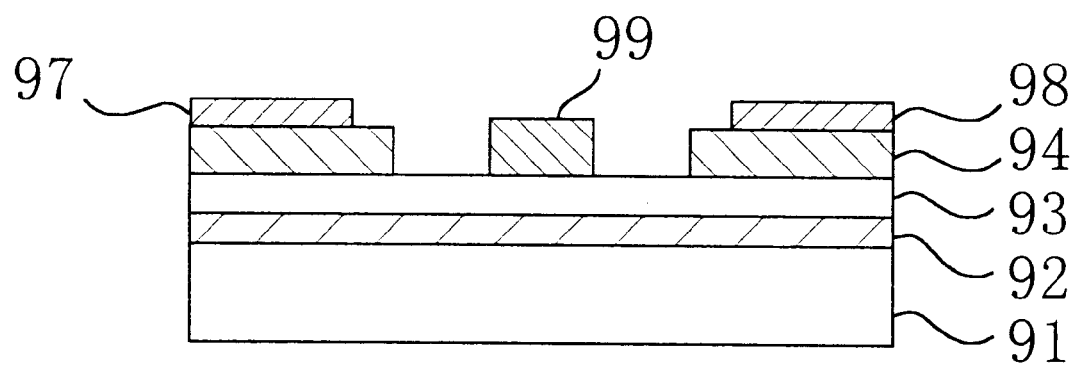
FIG. 7 shows a cross-sectional structure of a conventional MESFET using GaAs.

Next, as shown in FIG. 6(f), the fifth resist pattern 45 is lifted off so that the gate electrode 39B is formed of the metal film 39A.

A description will be given below to the operation of the field-effect transistor thus constituted.

FIG. 3(b) shows a cross-sectional structure of the field-effect transistor according to the present embodiment. The drawing qualitatively illustrates the flow of electrons in the normal state, the electron-hole pairs resulting from an avalanche breakdown caused in the gate electrode on the drain side, and the flow of the holes. In FIG. 3(b), the description of like components used in FIG. 5 will be omitted by assigning thereto like reference numerals. As shown in FIG. 3(b), the electrons 1 implanted into the region of the substrate close to the source electrode 37B flow into the region thereof close to the drain electrode 37C through the channel layer 31c. In the case where a gate bias sufficient to cause an avalanche breakdown is applied to the gate electrode 39B, on the other hand, numerous electron-hole pairs 3 each composed of the electron 1 and the hole 2 are produced in the region of the channel region 31c underlying the drain-side edge of the gate electrode 39B.

Since the present embodiment has provided the hole absorption region 31d made of p-type GaAs having a valence band higher in energy level than that of the channel region 31c under the channel region between the gate electrode 39B and the drain contact region 31b such that the edge portion of the gate electrode 39B close to the drain contact region 31b is connected to the drain contact region 31b, the holes 2 produced in the region of the channel layer 31c underlying the drain-side edge of the gate electrode 39B flow into the drain contact region 31b through the hole-absorption region 31d. The holes 2 are then recombined with other electrons 1 within the highly doped n-type drain contact region 31b. Consequently, an increase in the leakage current from the gate electrode upon an avalanche breakdown is suppressed, which improves breakdown voltage, prevents a runaway effect in the FET, and thereby enables stable operation with voltage close to a maximum breakdown value.

The reason why the hole absorption region 31d is not formed under the entire undersurface of the channel region 13c is that, if the holes 2 are to be extracted to the source electrode 37B through the region of the channel region 31c underlying the gate electrode 39B, they are retracted to the gate electrode 39B on the way because of a large distance, so that it is not effective.

Thus, in the planar GaAs MESFET manufactured by ion implantation also, the effect of improving the characteristics can be achieved more easily at lower cost by providing the hole absorption region 31d of a conductivity type opposite to that of the channel region 31c under the channel region 31c between the gate electrode 39B and the drain contact region 31b.

Similar effects can also be expected even when a material other than GaAs is used without depending on the type of the channel layer 31C.

What is claimed is:

1. A field-effect transistor comprising:

a channel layer doped with an impurity and formed on a semi-insulating substrate;

an undoped layer formed in a drain-side region of a gate-electrode formation region on said channel layer to have a stepped portion formed in an edge portion thereof close to the gate-electrode formation region;

a gate electrode formed indiscretely on said channel layer and said undoped layer in such a manner as to extend over said stepped portion; and a hole absorption layer formed in a region located between said channel layer and said undoped layer such that an indent is formed between said hole absorption layer and a drain-side side face of said gate electrode.

2. A field-effect transistor according to claim 1, wherein said channel layer is a semiconductor layer made of n-type GaAs and said hole absorption layer is a semiconductor layer made of InGaAs or p-type GaAs.

3. A field-effect transistor comprising:

a channel layer doped with an impurity and formed on a semi-insulating substrate;

an insulating layer formed in a drain-side region of a gate-electrode formation region on said channel layer to have a stepped portion formed in an edge portion thereof close to the gate-electrode formation region;

a gate electrode formed indiscretely on said channel layer and said insulating layer in such a manner as to extend over said stepped portion; and a hole absorption layer formed in a region located between said channel layer and said insulating layer such that an indent is formed between said hole absorption layer and a drain-side side face of said gate electrode.

4. A field-effect transistor according to claim 2, wherein said channel layer is a semiconductor layer made of n-type GaAs and said hole absorption layer is a semiconductor layer made of InGaAs or p-type GaAs.

5. A field-effect transistor comprising:

a semi-insulating substrate;

a source contact region and a drain contact region formed in said semi-insulating substrate to have a given gap therebetween, each of said source and drain contact regions being highly doped with an impurity of a first conductivity type;

a channel region formed in a region of said semi-insulating substrate located between said source and drain contact regions to provide connection between said source and drain contact regions, said channel region being doped with an impurity of the first conductivity type;

a gate electrode formed on said channel region; and a hole absorption region formed under said channel region to be located between said gate electrode and said drain contact region, said hole absorption region being doped with an impurity of a second conductivity type and having an edge portion connected to said drain contact region.

6. A field-effect transistor according to claim 5, wherein said semi-insulating substrate is made of GaAs, said first conductivity type is n-type, and said second conductivity type is p-type.

* * * * *